US010217698B2

United States Patent
Singh et al.

(10) Patent No.: US 10,217,698 B2
(45) Date of Patent: Feb. 26, 2019

(54) DIE ATTACHMENT FOR PACKAGED SEMICONDUCTOR DEVICE

(71) Applicant: NXP USA, Inc., Austin, TX (US)

(72) Inventors: Akhilesh K. Singh, Austin, TX (US); Rama I. Hegde, Austin, TX (US); Nishant Lakhera, Austin, TX (US)

(73) Assignee: NXP USA, Inc., Austin, TX (US)

( * ) Notice: Subject to any disclaimer, the term of this patent is extended or adjusted under 35 U.S.C. 154(b) by 10 days.

(21) Appl. No.: 15/383,521

(22) Filed: Dec. 19, 2016

(65) Prior Publication Data

US 2017/0098597 A1    Apr. 6, 2017

Related U.S. Application Data

(62) Division of application No. 14/521,451, filed on Oct. 22, 2014, now Pat. No. 9,559,077.

(51) Int. Cl.
*H01L 23/495*        (2006.01)
*H01L 23/00*         (2006.01)
(Continued)

(52) U.S. Cl.
CPC .... *H01L 23/49541* (2013.01); *H01L 21/4828* (2013.01); *H01L 21/561* (2013.01); *H01L 21/563* (2013.01); *H01L 23/3135* (2013.01); *H01L 23/3142* (2013.01); *H01L 23/49503* (2013.01); *H01L 23/49513* (2013.01); *H01L 23/49575* (2013.01); *H01L 24/11* (2013.01); *H01L 24/13* (2013.01); *H01L 24/27* (2013.01); *H01L 24/29* (2013.01); *H01L 24/30* (2013.01); *H01L 24/32* (2013.01); *H01L 24/33* (2013.01); *H01L 24/49* (2013.01); *H01L 24/73* (2013.01); *H01L 24/81* (2013.01); *H01L 24/83* (2013.01); *H01L 24/85* (2013.01); *H01L 24/92* (2013.01); *H01L 24/96* (2013.01); *H01L 24/97* (2013.01); *H01L 25/0655* (2013.01); *H01L 23/3107* (2013.01); *H01L 24/16* (2013.01); *H01L 24/48* (2013.01); *H01L 2224/119* (2013.01); *H01L 2224/1161* (2013.01); *H01L 2224/11334* (2013.01); *H01L 2224/11436* (2013.01);
(Continued)

(58) Field of Classification Search
CPC ........... H01L 23/49833; H01L 21/4828; H01L 21/4832; H01L 23/12–23/15; H01L 23/495–23/49596
USPC .......................... 438/111, 112, 123; 257/676
See application file for complete search history.

(56) References Cited

U.S. PATENT DOCUMENTS 6,306,684 B1 * 10/2001 Richardson ....... H01L 23/49513
                                                     156/153
6,551,859 B1 *  4/2003 Lee .................... H01L 21/4828
                                                       29/827
(Continued)

*Primary Examiner* — Kevin M Picardat

(57) ABSTRACT

A method for forming a packaged semiconductor device includes attaching a first major surface of a semiconductor die to a plurality of protrusions extending from a package substrate. A top surface of each protrusion has a die attach material, and the plurality of protrusions define an open region between the first major surface of the semiconductor die and the package substrate. Interconnects are formed between a second major surface of the semiconductor die and the package substrate in which the second major surface opposite the first major surface. An encapsulant material is formed over the semiconductor die and the interconnects.

14 Claims, 5 Drawing Sheets

(51) Int. Cl.
*H01L 21/48* (2006.01)
*H01L 21/56* (2006.01)
*H01L 23/31* (2006.01)
*H01L 25/065* (2006.01)

(52) U.S. Cl.
CPC .. *H01L 2224/131* (2013.01); *H01L 2224/133* (2013.01); *H01L 2224/13005* (2013.01); *H01L 2224/1319* (2013.01); *H01L 2224/1329* (2013.01); *H01L 2224/13082* (2013.01); *H01L 2224/13294* (2013.01); *H01L 2224/16245* (2013.01); *H01L 2224/2761* (2013.01); *H01L 2224/27334* (2013.01); *H01L 2224/27436* (2013.01); *H01L 2224/291* (2013.01); *H01L 2224/293* (2013.01); *H01L 2224/2919* (2013.01); *H01L 2224/2929* (2013.01); *H01L 2224/29294* (2013.01); *H01L 2224/30131* (2013.01); *H01L 2224/3201* (2013.01); *H01L 2224/32014* (2013.01); *H01L 2224/32245* (2013.01); *H01L 2224/32257* (2013.01); *H01L 2224/32258* (2013.01); *H01L 2224/3301* (2013.01); *H01L 2224/33505* (2013.01); *H01L 2224/48091* (2013.01); *H01L 2224/48106* (2013.01); *H01L 2224/48137* (2013.01); *H01L 2224/48247* (2013.01); *H01L 2224/48465* (2013.01); *H01L 2224/48471* (2013.01); *H01L 2224/73204* (2013.01); *H01L 2224/73257* (2013.01); *H01L 2224/73265* (2013.01); *H01L 2224/8185* (2013.01); *H01L 2224/81192* (2013.01); *H01L 2224/81201* (2013.01); *H01L 2224/81447* (2013.01); *H01L 2224/81455* (2013.01); *H01L 2224/81801* (2013.01); *H01L 2224/8385* (2013.01); *H01L 2224/83104* (2013.01); *H01L 2224/83192* (2013.01); *H01L 2224/83201* (2013.01); *H01L 2224/83385* (2013.01); *H01L 2224/83447* (2013.01); *H01L 2224/83455* (2013.01); *H01L 2224/83801* (2013.01); *H01L 2224/83851* (2013.01); *H01L 2224/83907* (2013.01); *H01L 2224/85205* (2013.01); *H01L 2224/85207* (2013.01); *H01L 2224/92* (2013.01); *H01L 2224/9205* (2013.01); *H01L 2224/9222* (2013.01); *H01L 2224/92227* (2013.01); *H01L 2224/92247* (2013.01); *H01L 2924/00014* (2013.01); *H01L 2924/01026* (2013.01); *H01L 2924/01028* (2013.01); *H01L 2924/1715* (2013.01); *H01L 2924/17747* (2013.01); *H01L 2924/181* (2013.01)

(56) References Cited

U.S. PATENT DOCUMENTS

| | | | | |
|---|---|---|---|---|
| 6,683,368 | B1* | 1/2004 | Mostafazadeh | H01L 21/4832 257/666 |
| 7,443,015 | B2* | 10/2008 | Punzalan | H01L 23/49503 257/673 |
| 7,808,089 | B2* | 10/2010 | Nguyen | H01L 24/32 257/666 |
| 8,138,586 | B2* | 3/2012 | Trasporto | H01L 23/3107 257/676 |
| 8,330,270 | B1* | 12/2012 | Lin | H01L 21/4828 257/666 |
| 8,536,689 | B2* | 9/2013 | Dimaano, Jr. | H01L 23/3107 257/666 |
| 8,987,063 | B2* | 3/2015 | Harata | H01L 23/49503 257/666 |
| 9,252,089 | B2* | 2/2016 | Mak | H01L 23/49541 |
| 2003/0001244 | A1* | 1/2003 | Araki | H01L 21/568 257/666 |
| 2006/0170081 | A1* | 8/2006 | Gerber | H01L 21/4832 257/666 |
| 2008/0079127 | A1* | 4/2008 | Gerber | H01L 21/4828 257/676 |
| 2009/0034225 | A1* | 2/2009 | Shoji | H01L 21/4832 361/809 |
| 2015/0115458 | A1* | 4/2015 | Palm | H01L 24/31 257/774 |
| 2016/0071743 | A1* | 3/2016 | How | H01L 21/4821 438/107 |

* cited by examiner

DIE ATTACHMENT FOR PACKAGED SEMICONDUCTOR DEVICE

CROSS-REFERENCE TO RELATED APPLICATIONS

This application is a divisional of U.S. patent application Ser. No. 14/521,451 having a filing date of Oct. 22, 2014, common inventors, and common assignee, which is incorporated by reference in its entirety.

BACKGROUND

Field

This disclosure relates generally to semiconductors, and more specifically, to die attachment for packaged semiconductor devices.

Related Art

Packaged semiconductor devices often include die attach materials that attach a semiconductor die to a lead frame. However, use of die attach materials often incur significant material costs, manufacturing costs, and processing costs. Further, a number of reliability issues arise during use of die attach materials, such as misplacement and tilt of the semiconductor die on the lead frame, voids or cracks in the die attach material that cause delamination or other failure, bleed of the die attach material to unwanted places on the lead frame, and the like.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

The present disclosure provides method and structure embodiments for die attachment in packaged semiconductor devices. A number of protrusions are formed on a die pad of a lead frame and a semiconductor die is attached to the protrusions using minimal die attach material, such as a pressure sensitive adhesive. The die attach material sufficiently attaches the semiconductor die to the lead frame to withstand forces during wire bonding. After wire bonding is performed to form wire bonds between the semiconductor die and bonding areas on the lead frame, an underfill material is dispensed to fill the space under the semiconductor die between the protrusions. The semiconductor die, protrusions, and die pad are then encapsulated with an encapsulant, which may be the same material as the underfill material or a different material. Since a minimal amount of die attach material is used, the resulting packaged semiconductor device has reduced die attach reliability concerns.

Example Embodiments

Figure 1:
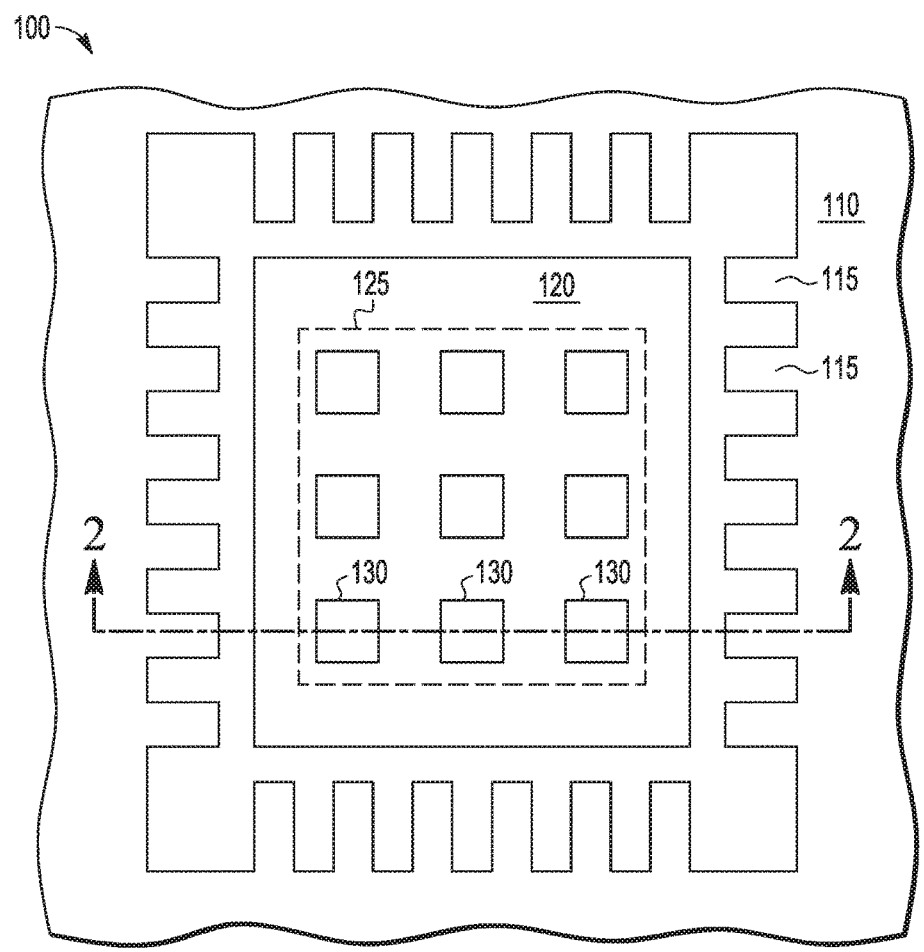
FIG. 1 illustrates a block diagram depicting a top-down surface view of an example semiconductor structure in which the present disclosure is implemented, according to some embodiments.

FIG. 1 illustrates a block diagram depicting a top-down surface view of an example semiconductor structure 100 in which the present disclosure is implemented. Semiconductor structure 100 includes a package substrate, such as a lead frame 110, which in turn includes lead fingers 115 and die pad 120, where lead fingers 115 are separated from die pad 120 by some amount of space. Lead fingers 115 each include a bonding area (also referred to as a bond pad) on a top surface of lead finger 115 to which wire bonds (also referred to as interconnects) can be attached to form external connections. Die pad 120 is a portion of lead frame 110 to which a semiconductor die may be attached to lead frame 110. Examples of lead frame 110 include, but are not limited to, a copper lead frame, a copper alloy lead frame containing nickel, iron, or other elements, or a non-copper alloy such as a nickel-iron alloy, and metal pre-plated lead frames.

A semiconductor die occupies an area over a top surface of die pad 120, which is also referred to as a die area 125, and is outlined by a dotted line in FIG. 1. In other words, the dotted line outlines a perimeter of the semiconductor die over die pad 120, where die area 125 is measured within the die's perimeter. A semiconductor die may be attached to die pad 120, as long as die area 125 of semiconductor die is located within an outer edge of die pad 120. In some embodiments, one or more semiconductor dies are placed over die pad 120, where a die area of each semiconductor die is located within the outer edge of die pad 120, as further discussed below in connection with FIG. 9. In some embodiments, such die areas are non-overlapping. Examples of a semiconductor die include, but are not limited to, an integrated circuit (IC) die, a semiconductor die including a semiconductor substrate, a high powered die, a low powered die, a sensor die, a passive component such as a resistor, a capacitor, an inductor, a battery, an oscillator, and the like, a sensor device, and the like. The semiconductor substrate described herein can be any semiconductor material or combinations of materials, such as gallium arsenide, silicon germanium, silicon-on-insulator (SOI), silicon, monocrystalline silicon, the like, and combinations of the above.

Although a particular placement of the semiconductor die is illustrated in FIG. 1, the one or more semiconductor die(s) may be placed at any position over the top surface area of die pad 120, depending on design choices implemented in the semiconductor structure. In the embodiment shown, die area 125 is off-centered on die pad 120. It is noted that die area 125 may be off-centered on die pad 120 in one or both x-axis and y-axis directions, although other embodiments may include die area 125 being centered on die pad 120.

Die pad 120 also includes a number of protrusions 130 that are located within die area 125. Protrusions 130 are part of lead frame 110, where protrusions 130 extend from the top surface of die pad 120. Protrusions 130 also have a top surface that is above the top surface of die pad 120. Protrusions 130 may be pillars, columns, posts, and the like. Protrusions 130 also have a geometric cross-sectional shape, which may be a polygonal shape (e.g., triangular, rectangular, octagonal, square), a curved shape (e.g., circular, oval), and the like. Protrusions 130 also have a cross-sectional size that may be enlarged or reduced to provide enough surface area to which the semiconductor die can be sufficiently attached. A number of protrusions 130 are formed in order to also ensure that enough surface area is provided for sufficient attachment of the semiconductor die.

While a particular layout of protrusions 130 is illustrated in FIG. 1, any number of protrusions 130 may be formed in any layout over die pad 120, depending on design choices implemented in the semiconductor structure. For example, a particular number and particular size of protrusions 130 may be implemented based on providing adequate surface area to which the semiconductor die is attached. The adequate surface area may be a minimum portion or percentage of die area 125. In some embodiments, a summation of the cross-sectional area of the protrusions 130 cover at least one third (⅓) of the die area 125. In other embodiments, a summation of the cross-sectional area of the protrusions 130 cover at least half (½) of the die area 125. In still other embodiments, a summation of the cross-sectional area of the protrusions 130 covers less than two thirds (⅔) of the die area 125. In still other embodiments, a summation of the cross-sectional area of the protrusions 130 cover less than three fourths (¾) of the die area 125. Protrusions 130 are further discussed below in connection with FIG. 2.

It is also noted that while a single lead frame 110 is illustrated in FIG. 1, semiconductor structure 100 may include multiple connected lead frames before singulation (e.g., a sheet of a number of lead frames). A cross-sectional side view of lead frame 110 is illustrated in FIG. 2.

Figure 2:
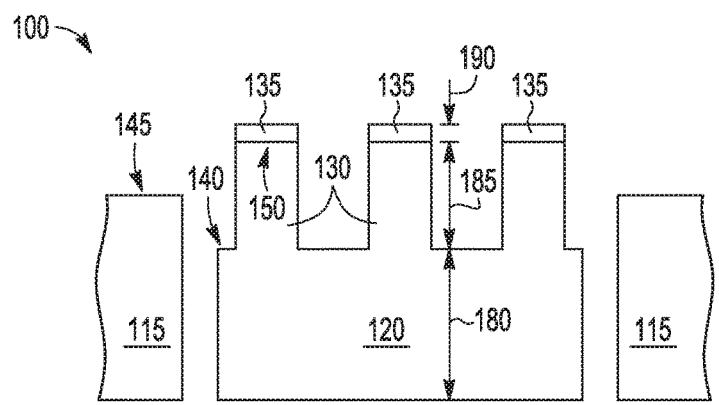
FIG. 2-6 illustrates block diagrams depicting cross-sectional side views of an example semiconductor structure during successive phases of a fabrication process that implements the present disclosure, according to some embodiments.

FIG. 2 illustrates a block diagram depicting a cross-sectional side view of semiconductor structure 100. Die pad 120 has an initial thickness of thickness 180 and thickness 185, where the initial thickness is measured from a bottom surface of die pad 120 (which is also generally a bottom surface of lead frame 110) to an initial top surface 150 of die pad 120. In some embodiments, the initial thickness ranges up to 1000 microns (1 mm).

Protrusions 130 are formed from die pad 120. In some embodiments, protrusions 130 are formed by stamping die pad 120, while in other embodiments, protrusions 130 are formed by etching a portion of die pad 120 back to expose a top surface of 140, leaving one or more remaining portions as protrusions 130 that extend from the top surface 140 of die pad 120. Protrusions 130 each have a thickness 185, measured from the top surface 140 of die pad 120 to a top surface 150 of protrusions 130 (which was previously the initial top surface of die pad 120). Thickness 185 of protrusions 130 ranges from 1% to 95% of the initial thickness of die pad 120. For example, the initial thickness may be 1000 microns, where thickness 185 ranges from 10 microns (1%) up to 950 microns (95%). Similarly, the remaining portion of die pad 120 (after formation of protrusions 130) has a thickness 180, which ranges from 5% to 99% of the initial thickness of die pad 120. Continuing the above example of an initial thickness of 1000 microns, thickness 180 ranges from 50 microns (5%) to 990 microns (95%). In some embodiments, thickness 185 is within one of a number of ranges including, but not limited to, 50-100 microns, 100-200 microns, and 200-500 microns.

Lead fingers 115 may have a same or differing thickness as die pad 120. A top surface 145 of lead fingers 115 may also be located at a same or differing position as the top surface 140 of die pad 120. In the embodiment shown, lead finger 115 has a top surface 145 that is above top surface 140 of die pad 120. In other embodiments, top surface 145 is below top surface 140, and in still other embodiments, top surface 145 is even with top surface 140.

Die attach 135 is a material having some adhesive strength that attaches semiconductor die 155 to protrusions 130 of lead frame 110. Die attach 135 is present over top surface 150 of each protrusion 130, having a thickness 190. In some embodiments, thickness 190 ranges from 0.5 microns to 200 microns, depending on the adhesive strength of the die attach material. For example, a die attach material with strong adhesive strength may only require a thickness 190 of 0.5 micron or 1 micron, while die attach materials with weaker adhesive strength may require a thickness of 100 microns or more. In some embodiments, die attach 135 is formed over each protrusion 130 after the protrusions 130 are formed. For example, after protrusions 130 are formed by stamping the die pad 120, die attach material is deposited or placed on the end of each protrusion 130. In other embodiments, die attach 135 is formed over die pad 120 before the protrusions 130 are formed. In such embodiments, a layer of die attach material is formed over an initial top surface 150 of die pad 120 that will become the top surface 150 of the protrusions 130. A mask protecting the locations of each protrusion 130 (and possibly other portions of lead frame 110) is formed above the layer of die attach 135, and die attach 135 and die pad 120 are etched to a depth that exposes the top surface 140 of die pad 120, leaving protrusions 130 extending upwards from top surface 140. The mask is then removed.

Die attach 135 has sufficient adhesion to attach semiconductor die 155 to protrusions 130 while withstanding ultrasonic or thermosonic forces present during wire bonding. One example of die attach 135 includes pressure sensitive adhesives, which are moisture, solvent, and high temperature resistant. Pressure sensitive adhesives may be useful for attaching low power devices, may be crosslinked or non-crosslinked, and may be styrene-based. By using pressure sensitive adhesives, which are activated with a sufficient amount of pressure, die attach dispense and cure steps are eliminated from the semiconductor structure assembly process, which also eliminates reliability concerns due to dispensing and curing die attach materials. Other die attach materials that do not require a cure step may also be used in other embodiments. Additional examples of die attach 135 include, but are not limited to, polymer adhesives, epoxies, solders, pastes, films, tailored die cut tapes, and the like. In some embodiments, high power devices may use solder material or conductive epoxy.

Figure 3:
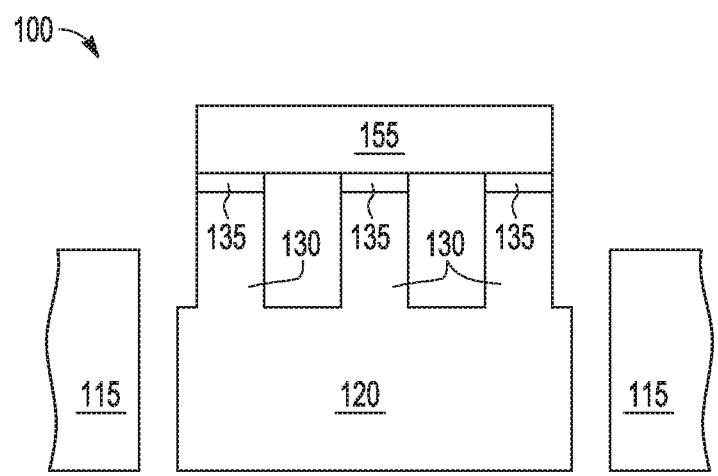

FIG. 3 illustrates a block diagram depicting a cross-sectional side view of semiconductor structure 100 after a semiconductor die 155 is attached to protrusions 130 via die attach 135. In some embodiments, die attach 135 is a pressure sensitive adhesive, where a sufficient amount of pressure is applied during placement of semiconductor die 155 to ensure adhesion between semiconductor die 155 and protrusions 130. In other embodiments, die attach 135 is an adhesive material that provides sufficient adhesion between semiconductor die 155 and protrusions 130.

Figure 4:
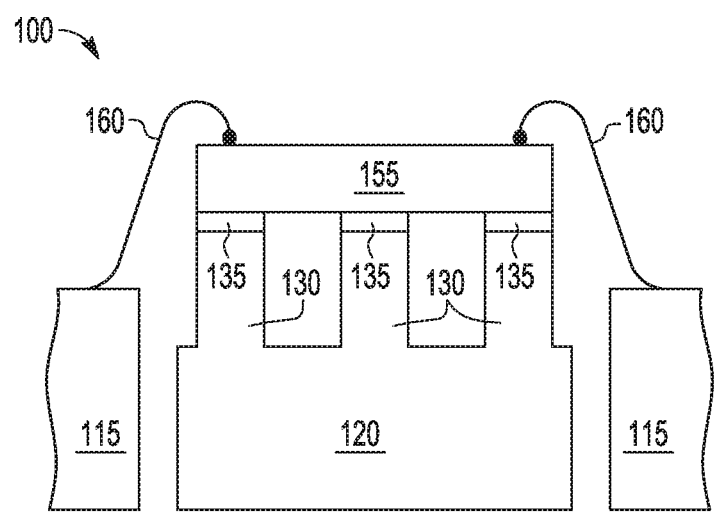

FIG. 4 illustrates a block diagram depicting a cross-sectional side view of semiconductor structure 100 after wire bonds 160 are formed from bond pads on a top surface of semiconductor die 155 to bonding areas on top surface 145 of lead fingers 115. Die attach 135 continues to provide sufficient adhesion between semiconductor die 155 and protrusions 130 while experiencing forces during wire bonding (e.g., ultrasonic, thermosonic).

Figure 5:
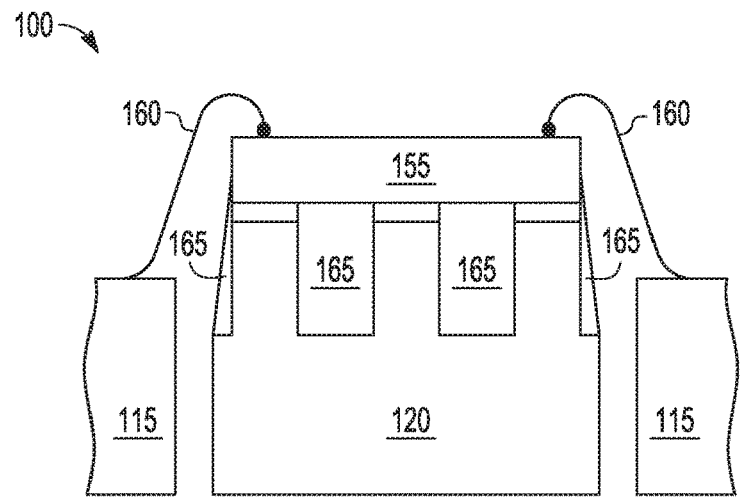

FIG. 5 illustrates a block diagram depicting a cross-section side view of semiconductor structure 100 after underfill material 165 is dispensed. A minimum number of protrusions 130 may be formed in order to improve the flow of underfill material 165 to fill the space or open region between protrusions 130 and thereby reduce a possibility for void formation. In other words, underfill material 165 contacts each protrusion, the top surface of die pad 120, and a bottom surface of semiconductor die 155. In some embodiments, underfill material 165 includes an average filler size of 1-5 microns, a filler sieve size of 20 microns, and fills spaces between protrusions 130 that are as small as 30 microns (e.g., during compression flow) to 60 microns wide (e.g., during transfer flow). Examples of underfill material 165 include, but are not limited to, thermally conductive underfill material, thermally non-conductive underfill material, polymer materials, mold compound, epoxy, and the like.

Figure 6:
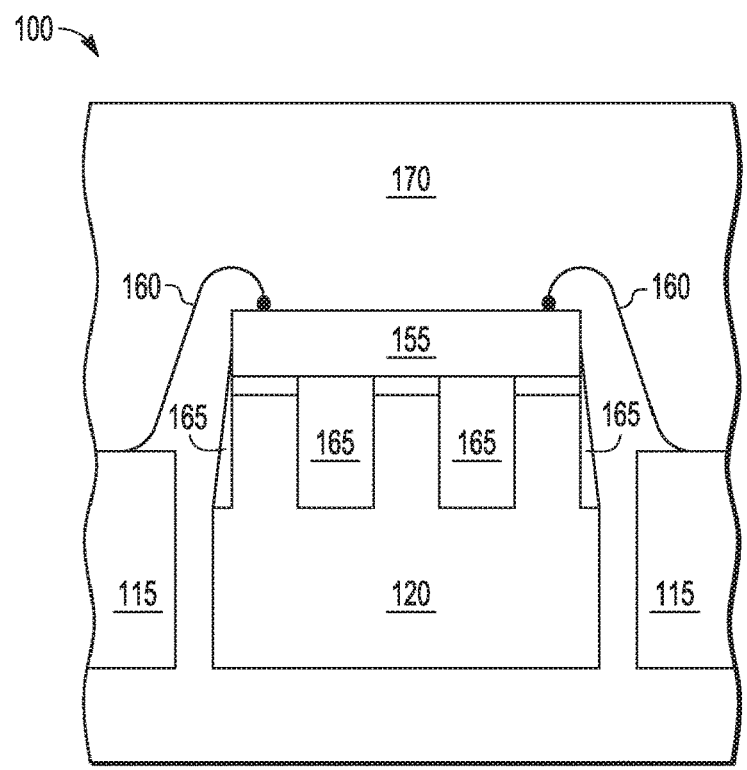

FIG. 6 illustrates a block diagram depicting a cross-sectional side view of semiconductor structure 100 after encapsulant 170 is formed. In the embodiment shown, encapsulant 170 surrounds and encapsulates semiconductor die 155, wire bonds 160, protrusions 130, and die pad 120, including over a back surface of die pad 120. In other embodiments, encapsulant 170 may not be formed over a back surface of die pad 120 (e.g., back surface of die pad 120 remains exposed). Encapsulant 170 protects semiconductor die 155 and wire bonds 160 from the ambient environment and further provides a secure attachment of semiconductor die 155 to die pad 120. Examples of encapsulant 170 include, but are not limited to, mold compound, polymer materials, epoxy, underfill, glob top, dam and fill, and the like.

In the embodiment shown in FIG. 6, the spaces between protrusions 130 are filled with underfill material 165, which is a different material than encapsulant 170. Another embodiment where the spaces between protrusions 130 are underfilled with a same material that encapsulates semiconductor die 155 is discussed below in connection with FIG. 7.

Figure 7:
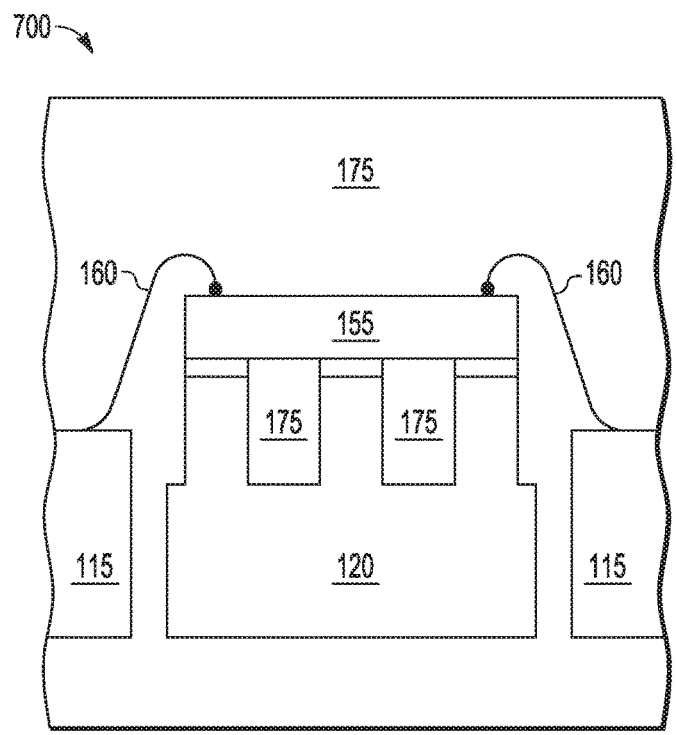
FIG. 7 illustrates a block diagram depicting a cross-sectional side view of another example semiconductor structure in which the present disclosure is implemented, according to some embodiments.

FIG. 7 illustrates a block diagram depicting a cross-sectional side view of another semiconductor structure 700 in which the present disclosure is implemented. In the embodiment shown, the spaces or open region between protrusions 130 is underfilled with encapsulant 175, which is a same material that encapsulates semiconductor die 155, wire bonds 160, protrusions 130, and die pad 120, including over a back surface of die pad 120. In other embodiments, encapsulant 175 may not be formed over a back surface of die pad 120 (e.g., back surface of die pad 120 remains exposed). Encapsulant 175 contacts each protrusion, the top surface of die pad 120, a bottom surface of semiconductor die 155.

Figure 8:
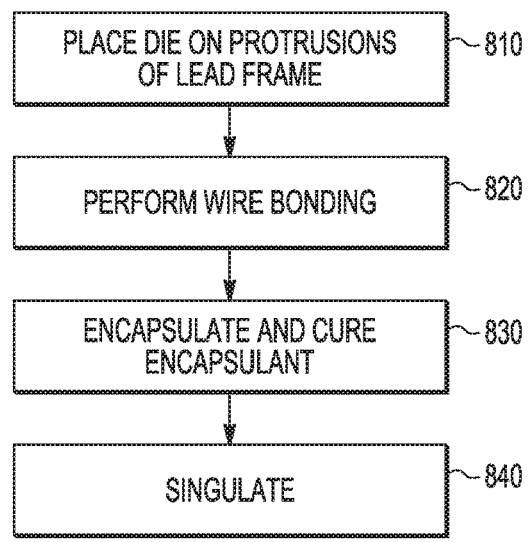
FIG. 8 illustrates a flowchart depicting a fabrication method in which the disclosure is implemented, according to some embodiments.

FIG. 8 illustrates a flowchart depicting a fabrication method in which the disclosure is implemented. The process begins at operation 810, where a semiconductor die is placed on protrusions of a lead frame, where each protrusion is tipped with a die attach material that sufficiently attaches the semiconductor die to the protrusion. In some embodiments, at least one semiconductor die is placed on each lead frame of a sheet of lead frames. In some embodiments, one or more semiconductor die(s) are placed on each lead frame. The process continues to operation 820, where wire bonding is performed. The process continues to operation 830, where the semiconductor die, wire bonds, protrusions, and die pad are encapsulated with an encapsulant, which is also cured. The process continues to operation 840, where the sheet of lead frames is singulated into individual lead frames. In other embodiments, a lead frame may have already been singulated before the one or more semiconductor die(s) are placed on the lead frame. The process then ends.

Figure 9:
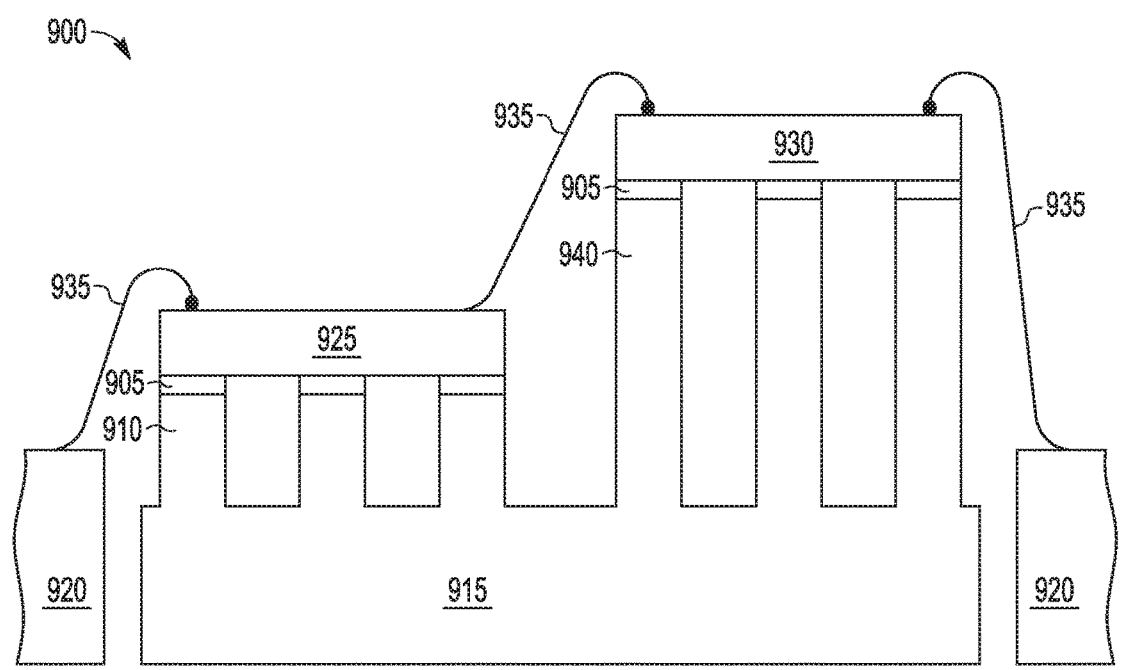
FIG. 9 illustrates a block diagram depicting a cross-sectional side view of an example packaged semiconductor device in which the disclosure is implemented, according to some embodiments.

FIG. 9 illustrates a block diagram depicting a cross-sectional side view of another example packaged semiconductor device 900 in which the disclosure is implemented. As illustrated, two dies are placed on lead frame 915, semiconductor die 925 and semiconductor die 930. Semiconductor dies 925 and 930 may be a same type or different type of semiconductor die. Semiconductor die 925 is attached to a first set of protrusions 910 via die attach 905, while semiconductor die 930 is attached to a second set of protrusions 940 via die attach 905. The first set of protrusions 910 and the second set of protrusions 940 are formed from (a single) die pad 915 and extend from a top surface of die pad 915. In the embodiment illustrated, the first set of protrusions 910 has a different thickness than the thickness of the second set of protrusions 940. In other embodiments, the first and second sets of protrusions 910 and 940 have a same thickness. Lead fingers 920 also have a top surface that may be above, below, or even with the top surface of die pad 915. Wire bonds 935 are formed from each of semiconductor dies 925 and 930 to bonding areas of lead fingers 920. As illustrated, a die area of semiconductor die 925 and die area of semiconductor die 930 are non-overlapping and fall within an outer edge of die pad 915.

By now it should be appreciated that there has been provided embodiments of methods and structures for die attachment in packaged semiconductor devices. The present disclosure provides a method embodiment for forming a packaged semiconductor device. The method includes attaching a first major surface of a semiconductor die to a plurality of protrusions extending from a package substrate. A top surface of each protrusion has a die attach material, and the plurality of protrusions define an open region between the first major surface of the semiconductor die and the package substrate. The method also includes forming interconnects between a second major surface of the semiconductor die and the package substrate, where the second major surface is opposite the first major surface. The method also includes forming an encapsulant material over the semiconductor die and the interconnects.

One aspect of the above embodiment further provides that the forming the encapsulant material is performed such that the encapsulant material contacts the first major surface of the semiconductor die and contacts portions of the second major surface of the semiconductor die located between protrusions of the plurality of protrusions.

A further aspect of the above embodiment further provides that the forming the encapsulant material comprises filling the open region with the encapsulant material.

Another aspect of the above embodiment further provides that the die attach material comprises a pressure sensitive adhesive.

Another aspect of the above embodiment further provides that no curing is performed after the attaching the first major surface of the semiconductor die to the plurality of protrusions and before the forming the interconnects.

Another aspect of the above embodiment further provides that the method further includes, prior to the forming the encapsulant material, filling the open region with an underfill material.

Another aspect of the above embodiment further provides that the package substrate is further characterized as a lead frame and the plurality of protrusions comprises a same material as the lead frame.

Another aspect of the above embodiment further provides that the method further includes attaching a first major surface of a second semiconductor die to a second plurality of protrusions extending from the package substrate, where a top surface of each protrusion of the second plurality of protrusions has a die attach material.

A further aspect of the above embodiment further provides that the top surfaces of the second plurality of protrusions extend further from the package substrate than the top surfaces of the plurality of protrusions.

Another further aspect of the above embodiment further provides that the method further includes forming interconnects between the second major surface of the semiconductor die and a second major surface of the second semiconductor die.

The present disclosure provides another method embodiment for forming a packaged semiconductor device. The method includes attaching a first major surface of a semiconductor die to a plurality of protrusions extending from a die area of a lead frame. A top surface of each protrusion has a die attach material, and the plurality of protrusions define an open region between the first major surface of the semiconductor die and the package substrate. The method also includes forming wire bonds between a second major surface of the semiconductor die and fingers of the lead frame, where the second major surface is opposite the first major surface. The method also includes forming an encapsulant material over the semiconductor die and the wire bonds, where the encapsulant material contacts the first surface of the semiconductor die and contacts the second major surface of the semiconductor die between protrusions of the plurality of protrusions.

One aspect of the above embodiment further provides that the forming the encapsulant material is performed such that the encapsulant material fills the open region.

Another aspect of the above embodiment further provides that no curing is performed after the attaching the first major surface of the semiconductor die to the plurality of protrusions and before the forming the wire bonds.

Another aspect of the above embodiment further provides that the die attach material comprises a pressure sensitive adhesive.

Another aspect of the above embodiment further provides that top surfaces of the plurality of protrusions is not in a same plane as a top surface of the fingers of the lead frame.

The present disclosure also provides an embodiment of a packaged semiconductor device that includes a package substrate comprising a plurality of protrusions extending from a top surface of the package substrate. The packaged semiconductor device also includes a semiconductor die over the plurality of protrusions. The semiconductor die is spaced apart from the top surface of the package substrate, and the plurality of protrusions define a region between the semiconductor die and the package substrate and around the protrusions. The packaged semiconductor device also includes an underfill material within the region and an encapsulant over the semiconductor die.

One aspect of the above embodiment further provides that the underfill material is a part of the encapsulant, wherein the encapsulant contacts a top surface and a bottom surface of the semiconductor die.

Another aspect of the above embodiment further provides that the package substrate and the plurality of protrusions are a same material.

Another aspect of the above embodiment further provides that the packaged semiconductor device also includes a die attach material between each protrusion and the plurality of protrusions and the semiconductor die.

Another aspect of the above embodiment further provides that a total surface area of the top surfaces of the plurality of protrusions is at least one third a surface area of the semiconductor die.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A packaged semiconductor device, comprising:
a package substrate comprising a plurality of first protrusions and a plurality of second protrusions extending from a top surface of the package substrate, each of the first and second protrusions having a top surface;

a plurality of first die attach material portions, each first die attach material portion in contact with each top surface of the first protrusions;
a plurality of second die attach material portions, each second die attach material portion in contact with each top surface of the second protrusions;
a first semiconductor die over the plurality of first protrusions, wherein the first semiconductor die is spaced apart from the top surface of the package substrate, wherein the first semiconductor die has a bottom surface having no bond pads that is in contact with the first die attach material portions, and wherein a first region is defined between the first semiconductor die and the top surface of the package substrate and around the first protrusions;
a second semiconductor die over the plurality of second protrusions, wherein the second semiconductor die is spaced apart from the top surface of the package substrate, wherein the second semiconductor die has a bottom surface having no bond pads that is in contact with the second die attach material portions, and wherein a second region is defined between the second semiconductor die and the top surface of the package substrate around the second protrusions;
wire interconnects formed between bond pads on a top surface of the first and second semiconductor dies and bonding areas on the top surface of the package substrate, wherein the top surfaces of the first and second protrusions are not in a same plane as the top surfaces of the bonding areas;
an underfill material within the first and second regions, wherein the underfill material contacts the top surface of the package substrate and the bottom surface of the first and second semiconductor dies between the plurality of first and second die attach material portions; and
an encapsulant over the first and second semiconductor dies and over the wire interconnects.

2. The packaged semiconductor device of claim 1, wherein the underfill material is a part of the encapsulant, wherein the encapsulant contacts a top surface and the bottom surface of the first and second semiconductor dies.

3. The packaged semiconductor device of claim 1, wherein the package substrate and the plurality of first and second protrusions are a same material, and the plurality of first and second protrusions comprises a plurality of posts.

4. The packaged semiconductor device of claim 1, wherein each top surface of the plurality of first and second protrusions is laterally separated from one another, and a total surface area of the top surfaces of the plurality of first protrusions is at least one third a surface area of the first semiconductor die.

5. The packaged semiconductor device of claim 1, wherein the package substrate comprises a lead frame.

6. The packaged semiconductor device of claim 1, wherein the first and second die attach material portions comprise a pressure sensitive adhesive.

7. The packaged semiconductor device of claim 1, wherein the top surfaces of the plurality of second protrusions extend further from the package substrate than the top surfaces of the plurality of first protrusions.

8. A packaged semiconductor device, comprising:
a lead frame comprising a plurality of first protrusions and a plurality of second protrusions extending from a top surface of a die pad of the lead frame, each of the first and second protrusions having a top surface;
a plurality of first die attach material portions, each first die attach material portion in contact with each top surface of the first protrusions;
a plurality of second die attach material portions, each second die attach material portion in contact with each top surface of the second protrusions;
a first semiconductor die over the plurality of first protrusions, wherein the first semiconductor die is spaced apart from the top surface of the die pad, wherein the first semiconductor die has a bottom surface having no bond pads that is in contact with the first die attach material portions, and wherein a first region is defined between the first semiconductor die and the top surface of the die pad and between the first protrusions;
a second semiconductor die over the plurality of second protrusions, wherein the second semiconductor die is spaced apart from the top surface of the die pad, wherein the second semiconductor die has a bottom surface having no bond pads that is in contact with the second die attach material portions, and wherein a second region is defined between the second semiconductor die and the top surface of the die pad and between the second protrusions;
wire interconnects formed between bond pads on a top surface of the first and second semiconductor dies and bonding areas on top surfaces of fingers of the lead frame, wherein the top surfaces of the first and second protrusions are not in a same plane as the top surfaces of the fingers;
an underfill material within the first and second regions, wherein the underfill material contacts the top surface of the die pad and the bottom surface of the first and second semiconductor dies between the plurality of first and second die attach material portions; and
an encapsulant over the first and second semiconductor dies and the wire interconnects.

9. The packaged semiconductor device of claim 8, wherein a major surface of the die pad of the lead frame and a major surface of each finger of the lead frame are located in a same plane.

10. The packaged semiconductor device of claim 8, wherein the underfill material is a part of the encapsulant, wherein the encapsulant contacts a top surface and the bottom surface of the first and second semiconductor dies.

11. The packaged semiconductor device of claim 8, wherein a total surface area of the top surfaces of the plurality of first protrusions is at least one third a surface area of the first semiconductor die.

12. The packaged semiconductor device of claim 8, wherein the first and second die attach material portions comprise a pressure sensitive adhesive.

13. The packaged semiconductor device of claim 8, wherein the top surfaces of the plurality of second protrusions extend further from the die pad than the top surfaces of the plurality of first protrusions.

14. The packaged semiconductor device of claim 8, wherein the die pad and the plurality of first and second protrusions are a same material.

\* \* \* \* \*